(12) United States Patent
Yang et al.

(10) Patent No.: US 8,049,345 B2
(45) Date of Patent: Nov. 1, 2011

(54) OVERLAY MARK

(75) Inventors: Chin-Cheng Yang, Hsinchu (TW); Chih-Hao Huang, Hsinchu (TW)

(73) Assignee: MACRONIX International Co., Ltd., Hsinchu (TW)

( * ) Notice: Subject to any disclaimer, the term of this patent is extended or adjusted under 35 U.S.C. 154(b) by 0 days.

(21) Appl. No.: 13/052,118

(22) Filed: Mar. 21, 2011

(65) Prior Publication Data

US 2011/0169175 A1 Jul. 14, 2011

Related U.S. Application Data

(62) Division of application No. 11/636,927, filed on Dec. 11, 2006, now Pat. No. 7,927,960.

(51) Int. Cl.
*H01L 23/544* (2006.01)

(52) U.S. Cl. .......... 257/797; 257/48; 257/E23.179; 438/401; 438/692; 438/710; 438/720; 438/700

(58) Field of Classification Search .......... 257/797, 257/E23.179, 48; 438/401, 692, 710, 700, 438/720
See application file for complete search history.

(56) References Cited

U.S. PATENT DOCUMENTS

| | | | | |
|---|---|---|---|---|
| 5,362,669 A | * | 11/1994 | Boyd et al. | 438/437 |
| 5,747,375 A | * | 5/1998 | Kaneko et al. | 438/396 |
| 5,919,714 A | * | 7/1999 | Chen et al. | 438/692 |
| 6,118,185 A | * | 9/2000 | Chen et al. | 257/797 |
| 7,449,792 B2 | * | 11/2008 | Yang et al. | 257/797 |
| 2005/0276465 A1 | * | 12/2005 | Chen | 382/151 |

* cited by examiner

*Primary Examiner* — Zandra Smith
*Assistant Examiner* — Telly Green
(74) *Attorney, Agent, or Firm* — Jianq Chyun IP Office (57) ABSTRACT

An overlay mark is used in pattern registration on a semiconductor wafer with an oxide layer. Four sets of two trenches each are formed in the oxide layer. Each trench in a set is parallel to the other trench of the same set. The trenches are configured such that each set forms one side of a box shape.

9 Claims, 9 Drawing Sheets

New OLM Design at CO Photo

Pilot Run after W-CMP

Product Run at ML Photo

Overlay Check After ML Etch

OVERLAY MARK

CROSS-REFERENCE TO RELATED APPLICATION

This is a divisional application of and claims the priority benefit of a prior application Ser. No. 11/636,927, filed on Dec. 11, 2006, now allowed. The entirety of the above-mentioned patent applications is hereby incorporated by reference herein and made a part of this specification.

BACKGROUND OF THE INVENTION

Overlay performance at the Back-End-Of-The-Line (BEOL) portion of integrated circuit fabrication is critical. Improper alignment of successively laid masks can lead to defective wafers. The increasingly smaller size of integrated circuits further complicates the process. Overlay shift error induced by metal deposition and Chemical-Mechanical Polishing (CMP) is of particular concern.

Figure 1A:
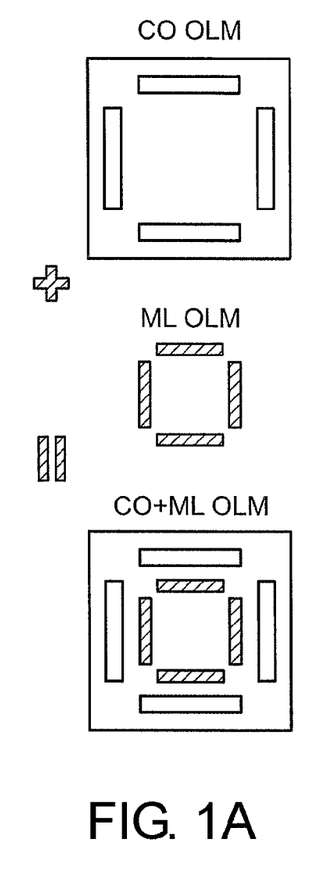
FIG. 1A shows an overhead view of the objective of the overlay process on the wafer.

FIG. 1A shows the objective of the process. Four trenches etched in an oxide layer of a semiconductor wafer form the edges of a box. At a later point in the manufacture, four ridges of a metal layer will form a similar pattern to be situated within the oxide pattern. Unfortunately, current methods result in this configuration being misaligned by overlay shift.

Figure 1B:
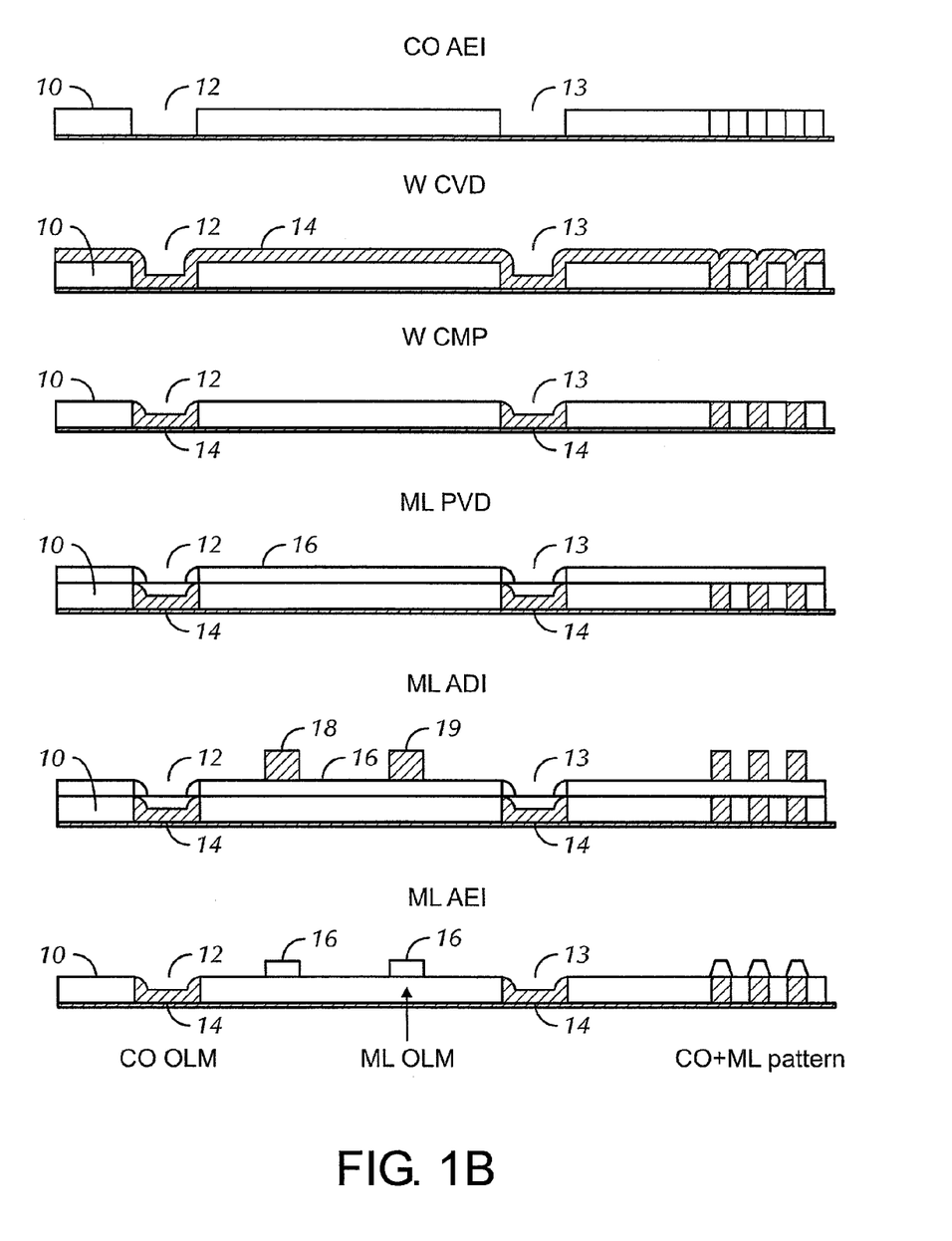
FIG. 1B shows a cross-sectional view of the wafer in the various stages of manufacture.
Figure 2:
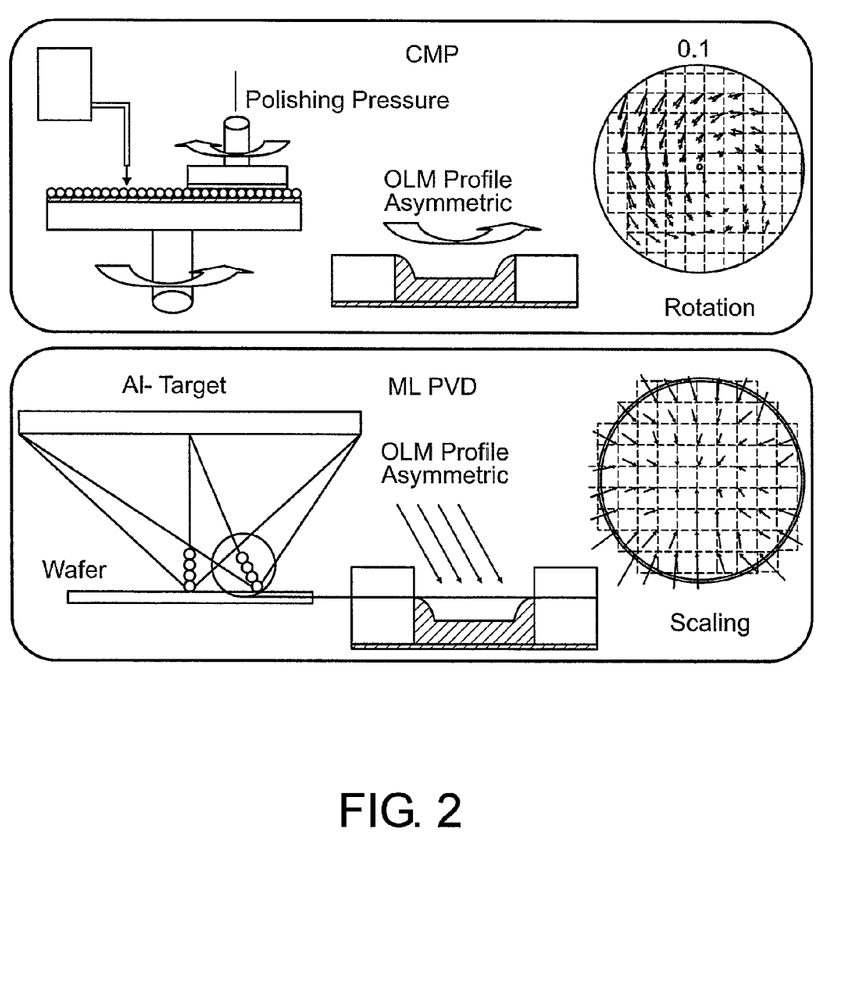
FIG. 2 shows the difficulties of obtaining symmetrical profiles with CMP and PVD processes.

FIG. 1B shows a cross-sectional view of the wafer in FIG. 1a in the various stages of manufacture. Trenches 12 and 13 are etched into oxide layer 10. A first metal layer 14, usually tungsten, is deposited over the surface. The tungsten layer 14 undergoes a CMP process, which leaves the tungsten remaining in trenches 12 and 13 asymmetrical in profile. FIG. 2 shows that the rotation pattern of a polishing apparatus makes it difficult to achieve a truly symmetric result. This is the first source of error in the overlay alignment.

Referring again to FIG. 1B, a second metal layer 16 is then deposited over the surface. The irregular contour of the tungsten layer 14 in trenches 12 and 13 is amplified by the metal layer 16, and the shift error is increased. FIG. 2 again shows that the technique of using plasma vapor deposition (PVD) of the metal layer creates irregularities. Referring again to FIG. 1B, a photoresist layer pattern 18 and 19 is deposited on the metal layer 16 in the desired configuration. It is aligned using the first pattern in the oxide 10, which is now shifted. When the metal layer 16 is etched according to the photoresist pattern 18 and 19, the result is a misalignment of the two box configurations.

Figure 3A:
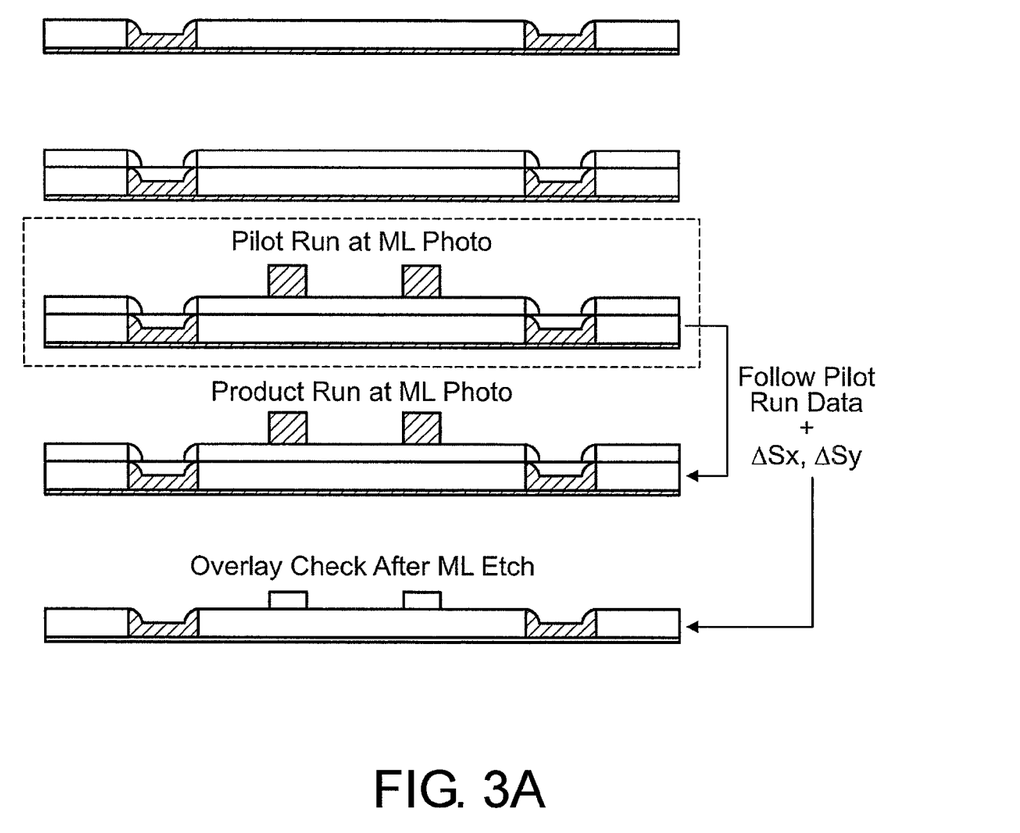
FIG. 3A shows the prior art method of wafer batch metal layer etching.

The problem can affect wafer yield due in part to the Advanced Process Control (APC) algorithm used for batch production. As shown in FIG. 3A, a pilot run is done on a wafer by aligning the photoresist material after the second metal deposition, as discussed above. The data from the pilot run is then used to align the photoresist material on all subsequent wafers, with a $\Delta S_x$ and $\Delta S_y$ factored in to account for overlay shift.

This is an arduous task. $\Delta S_x$ and $\Delta S_y$ can vary in value, depending on metal layer target lifetime and the chamber and tools used. A very complex APC and photo running mode are also required to achieve an acceptable overlay. It is therefore desirable to use a method which overcomes the induced overlay shift without being impacted by variations in process, tools used, or time. It is also desirable to use a method which avoids a complex APC system for overlay control, and creates an improvement in total wafer yield. It is also desirable to utilize a method which does not carry prohibitive cost and does not require extra process steps.

BRIEF SUMMARY OF THE INVENTION

An overlay mark is used in pattern registration on a semiconductor wafer with an oxide layer. Four sets of two trenches each are formed in the oxide layer. Each trench in a set is parallel to the other trench of the same set. The trenches are configured such that each set forms one side of a box shape.

An overlay mark for use in pattern registration comprises an oxide layer having four sets of two trenches formed therein and a metal layer. The oxide layer is disposed on a semiconductor wafer. Each trench in a set is parallel to the other trench of the set, and each set forms one side of a box shape. The metal layer is disposed in each trench, wherein the height of the metal layer in each trench is level with the height of the surrounding oxide layer.

A method of performing a pattern registration on a semiconductor wafer is provided that includes forming trenches in an oxide layer. Each trench is filled with a first metal layer. An overlay setting is obtained between a photoresist mask and the filled trenches prior to depositing a second metal layer over the oxide layer and the filled trenches. The top surface of the second metal layer is coated with a layer of photoresist according to the overlay setting.

BRIEF DESCRIPTION OF THE DRAWINGS

The foregoing summary, as well as the following detailed description of preferred embodiments of the invention, will be better understood when read in conjunction with the appended drawings. For the purpose of illustrating the invention, there is shown in the drawings embodiments which are presently preferred. It should be understood, however, that the invention is not limited to the precise arrangements and instrumentalities shown.

DETAILED DESCRIPTION OF THE INVENTION

Figure 3B:
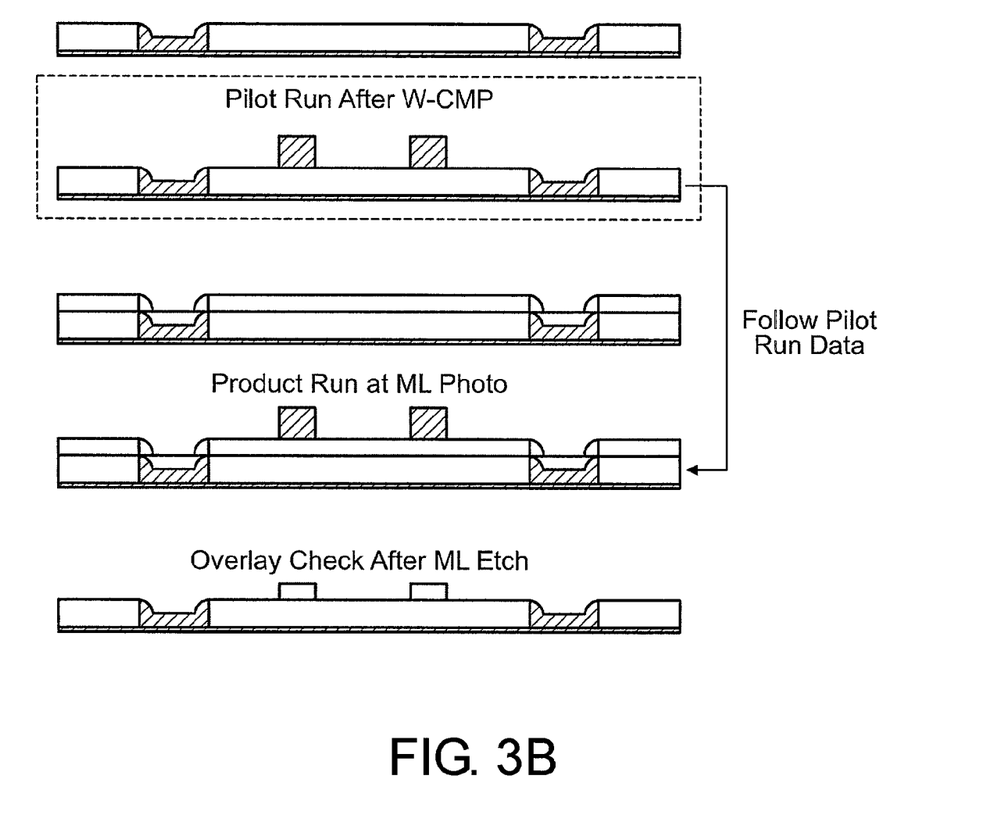
FIG. 3B shows a method for wafer batch metal layer etching in accordance with a preferred embodiment of the present invention.

FIG. 3B shows an algorithm which can be implemented to eliminate the overlay shift caused by the metal deposition. In one preferred embodiment of the present invention, the pilot run performed on the initial wafer is done following the CMP of the first metal layer, which is typically, but not limited to, tungsten. By aligning the photoresist material prior to metal deposition, any shift error attributable to the PVD process is bypassed. No error calculations $\Delta S_x$ or $\Delta S_y$ are necessary. The batch of wafers is produced according to the calibration from the pilot run.

Although the metal deposition induced overlay shift is offset by the algorithm, this still does not resolve the problem of removing the tungsten-CMP induced overlay shift. Even with the algorithm, an error of approximately 5 nm to 10 nm is expected. However, using a different overlay mark for the trenches in the oxide layer above the semiconductor wafer, in conjunction with the algorithm, offsets all of the shift error.

Figure 4A:
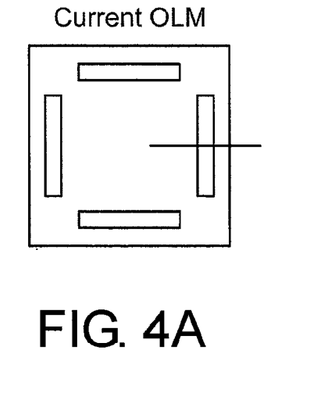
FIG. 4A shows an overhead view of the prior art overlay mark in the oxide layer.
Figure 4B:
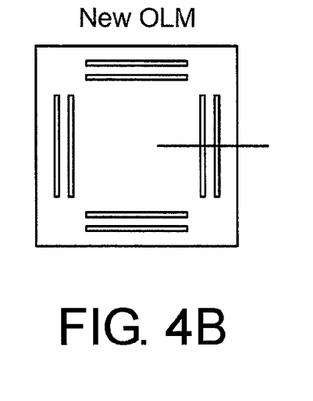
FIG. 4B shows an overhead view of an overlay mark in accordance with a preferred embodiment of the present invention.

FIG. 4A shows the overlay mark presently used. As in FIG. 1A, trenches are formed in the oxide layer above the semiconductor wafer, with each trench serving as the side of a box pattern. The trenches can typically range from 2 μm to 4 μm in width. FIG. 4B shows the mark for use in embodiments of the present invention. Instead of using four singular trenches, four sets of two trenches each are used. The trenches in each set are parallel to each other and form the sides of the box pattern. In one preferred embodiment, the trenches are formed with a width of about 0.4 μm each.

Figure 5:
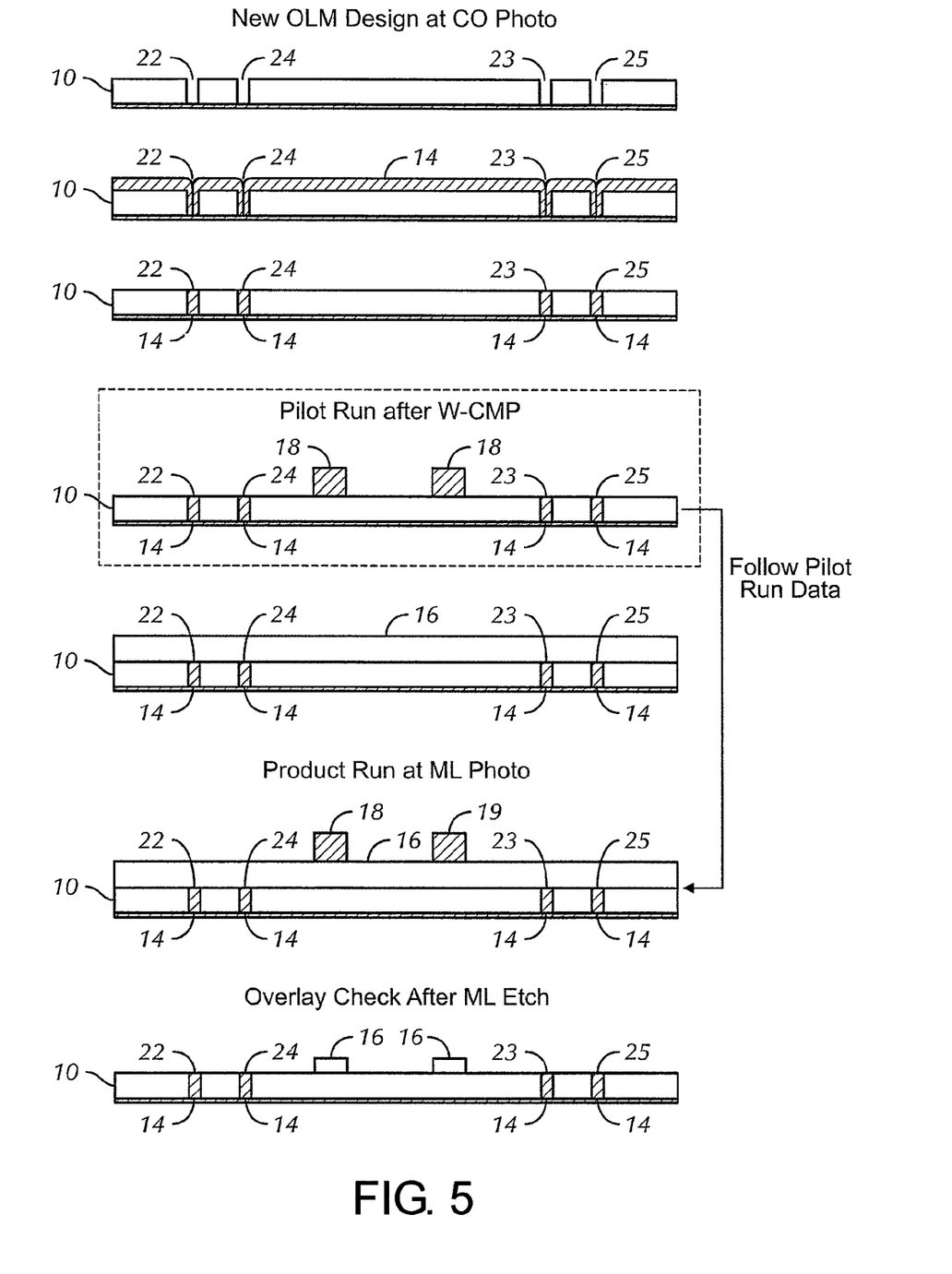
FIG. 5 shows a method of wafer batch production in accordance with preferred embodiment of the present invention.

FIG. 5 shows a cross-sectional view of the wafer in various stages of the method according to one preferred embodiment of the present invention. After depositing an oxide layer 10 on the semiconductor wafer (not shown in FIG. 5), the first step shown in FIG. 5 is formation of the new overlay mark as discussed above. Trenches 22 and 24 are etched parallel to each other to form a set. Trenches 23 and 25 are etched parallel to each other to form a separate set. The trenches 22, 23, 24, and 25 may be elongated and of rectangular shape. A first metal layer 14 is deposited and overfills the trenches 22, 23, 24, and 25. In one preferred embodiment, the trenches 22, 23, 24, and 25 are overfilled with tungsten. A CMP process is performed to remove the excess metal layer 14, leaving the metal within the trenches 22, 23, 24, and 25, and with height about level with the surrounding oxide 10.

By polishing the metal layer 14 to be level with the oxide 10, the effects of asymmetrical profiles are bypassed. A flat surface remains, enabling an accurate overlay alignment. As provided above, the new algorithm is applied. A pilot run is performed by depositing the photoresist layer pattern 18 and 19 in the desired configuration. After the data is recorded, the second metal layer 16 may be deposited. The photoresist layer pattern 18 and 19 is placed on the second metal layer 16 according to the pilot run data, and the second metal layer 16 is etched appropriately. A batch of wafers may be prepared using the pilot run data, and with the increased accuracy of the overlay alignment, a higher wafer yield is produced.

Figure 6:
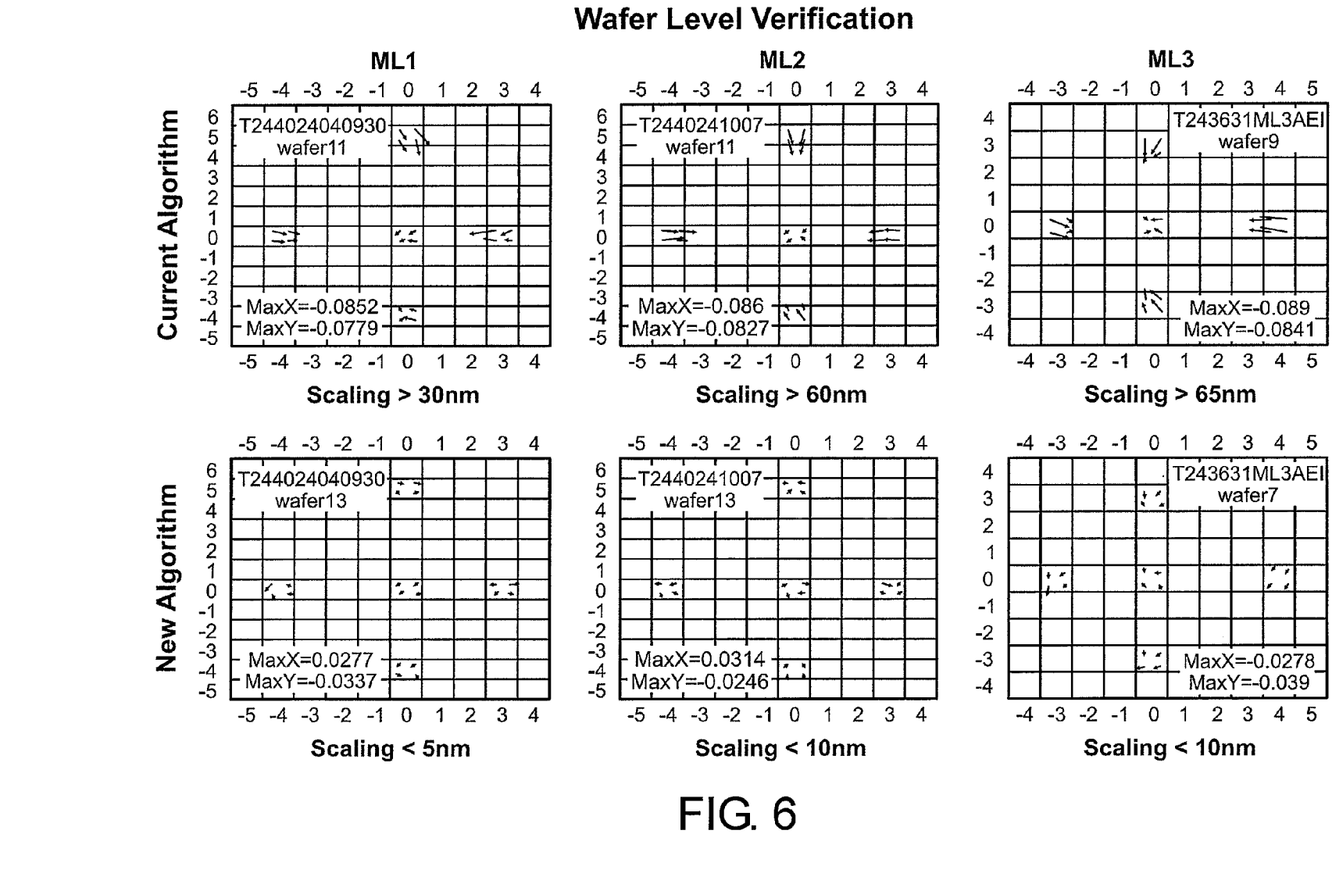
FIG. 6 shows plots comparing overlay error measurement on wafers manufactured using prior art techniques against wafers manufactured using techniques in accordance with preferred embodiments of the present invention.

FIG. 6 shows results of error measurements performed on several test wafers. The arrows represent a vector of the overlay mark measurement error. In these plots, five locations where marks were formed on the wafer were chosen for analysis. Each mark was tested to determine the measurement error amount at the four corners of the mark. The top three plots are taken from wafers with prior art overlay marks and manufactured by performing the pilot run after deposition of the metal layer (ML1, ML2, or ML3). The thickness of the metal in each plot is as follows: ML3>ML2>ML1. These wafers utilized AlCu as the metal layer. It can be seen that the $\Delta S_x$ and $\Delta S_y$ shift values are quite significant. These values tend to increase with the thickness of the metal layer, and large scaling effect is seen.

Conversely, the bottom three plots in FIG. 6 are taken from wafers with the overlay mark as described herein and manufactured by performing the pilot run after the CMP of the metal layer. Again the metal layer is AlCu and the thicknesses as follows: ML3>ML2>ML1. The vectors are now much smaller, indicating a more accurate overlay result. The scaling effect is also much smaller and more acceptable for batch production.

Figure 7:
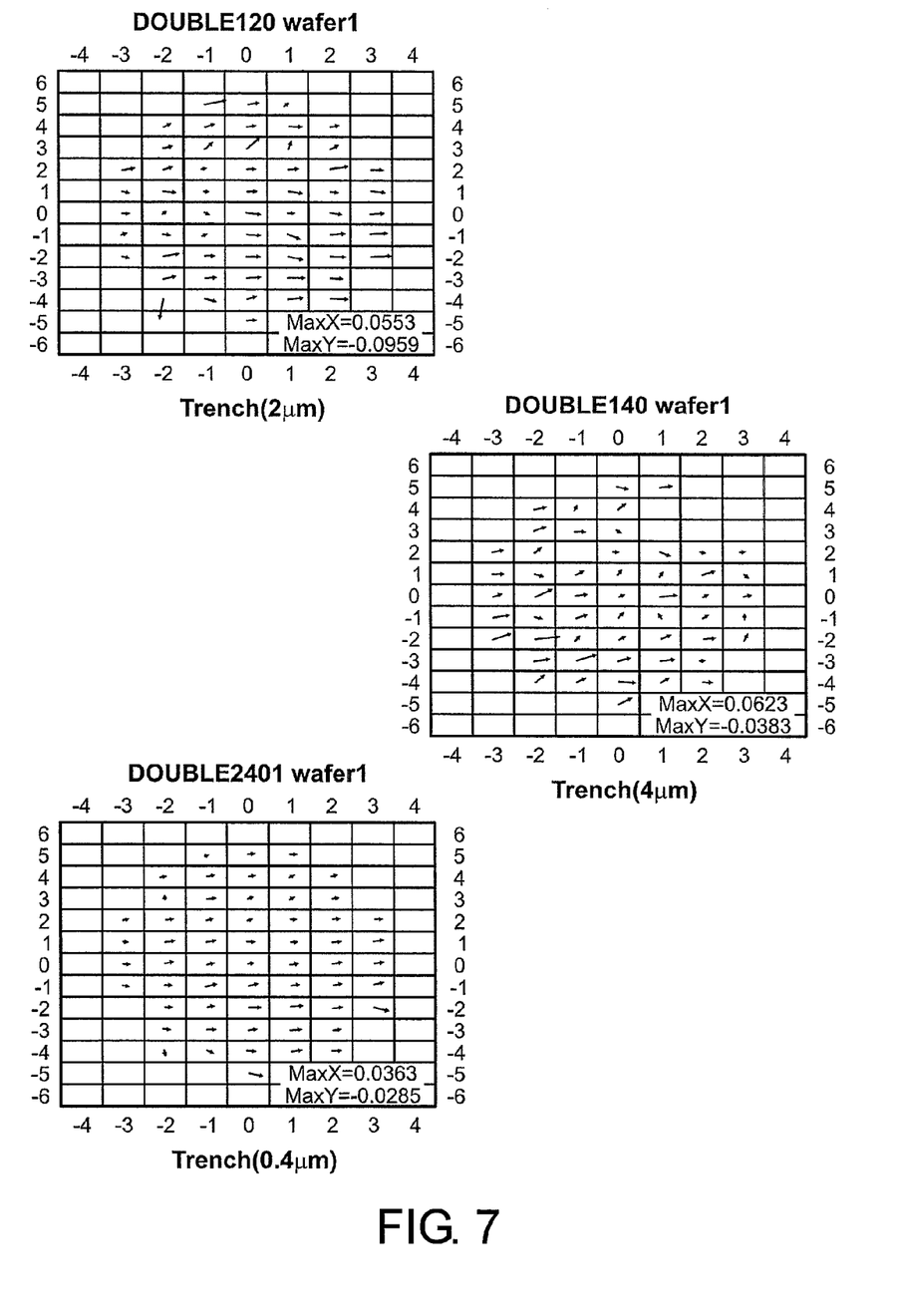
FIG. 7 shows plots comparing overall overlay error measurement on wafers manufactured using prior art techniques against wafers manufactured using techniques in accordance with preferred embodiments of the present invention.

FIG. 7 shows similar plots, but illustrates overall error on the entire wafer. The first two plots are taken from wafers having the prior art marks with trenches of 2 μm and 4 μm, as indicated. The third plot is taken from a wafer using wafer marks, as described in embodiments of the present invention, with trenches of 0.4 μm. Comparing the results, the error vectors in the third plot are much smaller than the error vectors of the first two. The vectors in the third wafer also are mostly aligned in the same direction, whereas in the first two wafers the arrangement of the vectors is very random. Because the smaller trenches are fully filled by the metal layer, the type of CMP process used on the wafer has little impact on the accuracy of the overlay.

Figure 8:
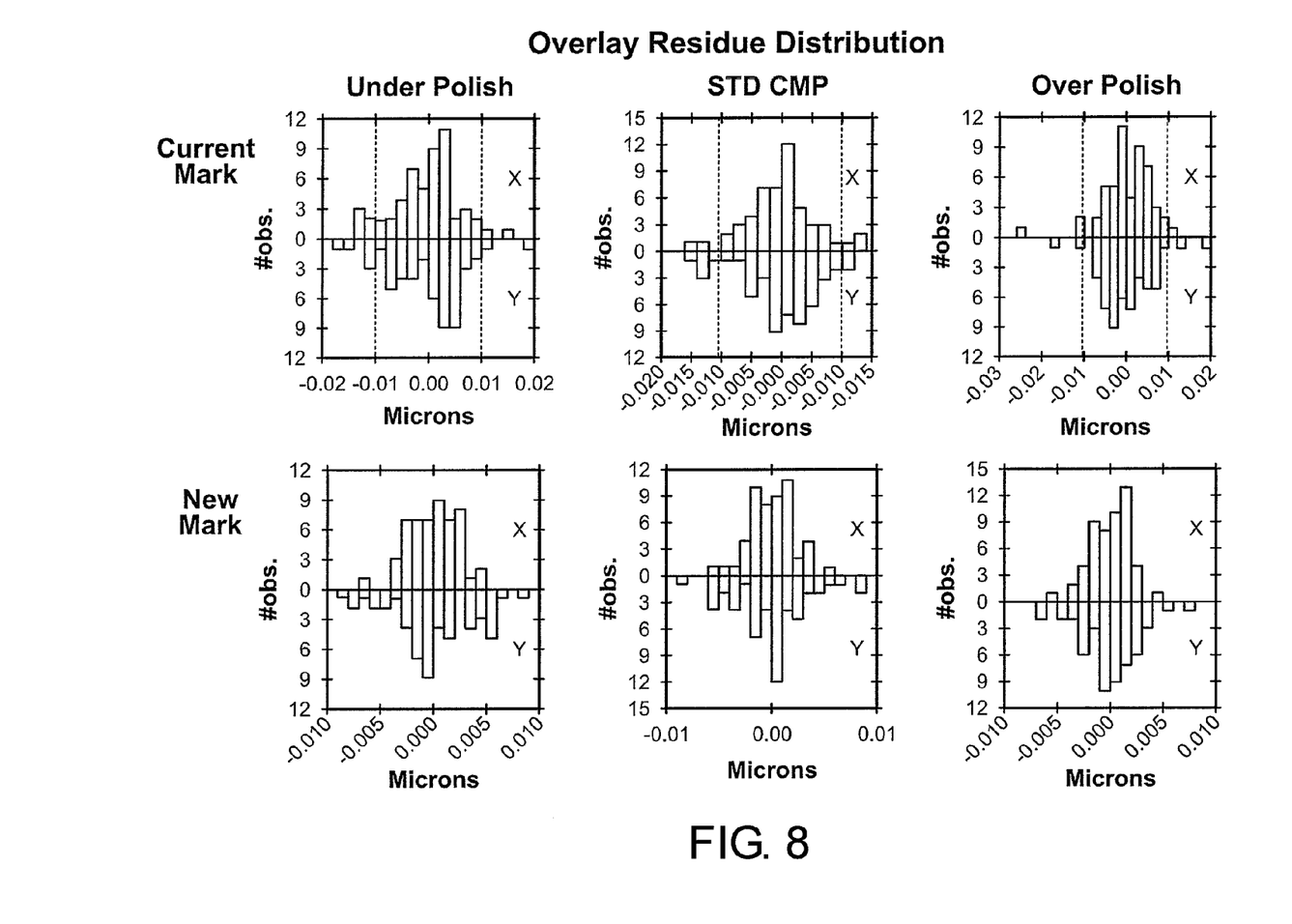
FIG. 8 shows plots comparing overlay error distribution for different polishing techniques on wafers manufactured using prior art techniques against wafers manufactured using techniques in accordance with preferred embodiments of the present invention.

FIG. 8 compares the error distribution of wafers using the prior art overlay mark against wafers using the mark as described in embodiments of the present invention. Both x and y directions are shown on each plot. The values are compared for different polishing techniques. Under-polish is a technique where the polish time is shorter than in standard CMP (STD CMP), and over-polish is a technique where the polish time is longer than in STD CMP.

In each case, the wafer utilizing the overlay mark as described in embodiments of the present invention has a much tighter distribution, with no error values being found beyond +/−0.01 μm. The distributions are also tightly grouped around the 0 value. The prior art overlay mark does not perform as well. The +/−0.01 μm margins are indicated by the dashed lines on the top plots. A significant number of error values are found outside of these margins. The overlay mark as described in embodiments of the present invention thus shows better performance, independent of the polishing technique.

It will be appreciated by those skilled in the art that changes could be made to the embodiments described above without departing from the broad inventive concept thereof. It is understood, therefore, that this invention is not limited to the particular embodiments disclosed, but it is intended to cover modifications within the spirit and scope of the present invention.

What is claimed is:

1. An overlay mark for use in pattern registration comprising:
 a semiconductor wafer having an oxide layer, the oxide layer having four sets of two trenches each formed therein, each trench in a set being parallel to the other trench of the set, configured such that each set forms one side of a box shape; and a metal layer, disposed in each trench, wherein the height of the metal layer in each trench is level with the height of the surrounding oxide layer.

2. The overlay mark of claim 1, wherein each trench is elongated and rectangular in shape.

3. The overlay mark of claim 1, wherein the sets of trenches are formed around a periphery of the semiconductor wafer.

4. The overlay mark of claim 1, wherein each trench has a width of about 0.4 μm.

5. An overlay mark for use in pattern registration comprising:

an oxide layer having four sets of two trenches formed therein, disposed on a semiconductor wafer, wherein each trench in a set being parallel to the other trench of the set, and each set forms one side of a box shape; and a metal layer, disposed in each trench, wherein the height of the metal layer in each trench is level with the height of the surrounding oxide layer.

6. The overlay mark of claim 5, wherein each trench is elongated and rectangular in shape.

7. The overlay mark of claim 5, wherein the sets of trenches are formed around a periphery of the semiconductor wafer.

8. The overlay mark of claim 5, wherein each trench has a width of about 0.4 µm.

9. The overlay mark of claim 5, wherein a material of the metal layer comprises tungsten.

\* \* \* \* \*